United States Patent [19]

Pampalone et al.

[11] Patent Number: 4,609,614
[45] Date of Patent: Sep. 2, 1986

[54] PROCESS OF USING ABSORPTIVE LAYER IN OPTICAL LITHOGRAPHY WITH OVERLYING PHOTORESIST LAYER TO FORM RELIEF PATTERN ON SUBSTRATE

[75] Inventors: Thomas R. Pampalone, Morris County; Ahmad H. Khan, Hudson County; James J. DiPiazza, Mercer County, all of N.J.

[73] Assignee: RCA Corporation, Princeton, N.J.

[21] Appl. No.: 748,355

[22] Filed: Jun. 24, 1985

[51] Int. Cl.[4] .................... G03F 7/26; H01L 21/308; H01L 21/312
[52] U.S. Cl. .................................. 430/323; 430/156; 430/166; 430/312; 430/313; 430/314; 430/316; 430/317; 430/325; 430/326; 430/327; 430/330
[58] Field of Search ............... 430/312, 323, 313, 317, 430/326, 296, 314, 316, 156, 166, 325, 327, 330; 156/643

[56] References Cited

U.S. PATENT DOCUMENTS

| | | | |
|---|---|---|---|
| 3,873,313 | 3/1975 | Horst et al. | 430/312 |
| 4,244,799 | 1/1981 | Fraser et al. | 156/643 |
| 4,362,809 | 12/1982 | Chen et al. | 430/312 |
| 4,370,405 | 1/1983 | O'Toole et al. | 430/312 |
| 4,384,040 | 5/1983 | Von Meer | 430/532 |
| 4,522,681 | 6/1985 | Gorowitz et al. | 156/643 |
| 4,535,053 | 8/1985 | West et al. | 430/330 |

OTHER PUBLICATIONS

Lin, B. J., et al., *J. Vac. Sci. Tech.*, "Practicing the Novolac Deep-UV Portable Conformable Masking Technique", vol. 19(4), 11-12/1981, pp. 1313-1319.

Hatzakis, M. et al., *Solid State Tech.*, "Multilayer Resist Systems for Lithography", 8/1981, pp. 74-80.

Hoyle, Modern Paint and Coatings, Jun. 1984, pp. 44-48.

Decker, Journal of Coatings Technology, vol. 56, No. 713, Jun. 1984, pp. 29-34.

Rosilio et al., Microelectronic Engineering, vol. 1, pp. 197-208, 1983.

Reichmanis et al., J. Electrochemical Soc., vol. 132, No. 5, pp. 1178-1182, May 1985.

The Colour Index, Third Ed. vol. 7, The Society of Dyers and Colourists, p. 7094, 1982.

*Primary Examiner*—Charles L. Bowers, Jr.
*Attorney, Agent, or Firm*—Birgit E. Morris; R. Hain Swope

[57] ABSTRACT

A multilayer, photoresist recording medium is disclosed which comprises an absorptive layer and an oxygen plasma-resistant photoresist layer thereover. The structure is substantially free of intermixing of the two layers and separation of the photoresist layer during processing. The absorptive layer is formed by a two-step curing of a composition comprising a solution of a multifunctional acrylate or methacrylate monomer, a suitable dye and a photoinitiator in a suitable solvent. A coating of this composition is rapidly solidified to form an absorptive layer by high intensity irradiation and then baked to remove residual solvent and assure complete polymerization of the monomer.

6 Claims, No Drawings

PROCESS OF USING ABSORPTIVE LAYER IN OPTICAL LITHOGRAPHY WITH OVERLYING PHOTORESIST LAYER TO FORM RELIEF PATTERN ON SUBSTRATE

This invention pertains to an improved light-absorptive layer in a multilayer photoresist recording medium. More particularly, this invention relates to an improved bi-layer photoresist recording medium developable by oxygen plasma etching.

BACKGROUND OF THE INVENTION

Multilayer photoresist recording media and their use in forming patterned layers on a substrate are known. A bi-layer medium typically comprises a base or planarizing layer and a photoresist or patterning layer thereover. A tri-layer medium typically includes an intermediate layer, usually an inorganic oxide or nitride, which functions as a hardmask.

The incorporation of a dye into the base layer of a bi-layer resist recording medium is disclosed, for example, in U.S. Pat. No. 4,362,809, issued Dec. 7, 1982. The incorporation of a dye into the base layer of a tri-layer resist recording medium is disclosed in U.S. Pat. No. 4,370,405, issued Jan. 25, 1983. The dye functions as a light absorber during pattern irradiation of the photoresist layer to prevent light from reflecting from the substrate into nonirradiated portions of the photoresist layer, thus causing a loss of resolution.

A commercial preparation useful as a light-absorptive layer in such media contains an appropriate dye and a polyimide resin. A significant problem associated with this class of absorptive layer is that there is very low processing latitude with regard to both the temperature and duration of the bake required to cure the polyimide layer to the desired degree. The correct degree of cure is necessary in order that the polyimide layer develops satisfactorily during development of the overlying photoresist layer. Low processing latitudes are undesirable in commercial device fabrication since they generally result in low device yields.

It is also reported in the literature to incorporate an appropriate dye in a poly(methylmethacrylate) (PMMA) layer as the light absorber in a bi- or tri-layer resist recording medium. A particular disadvantage of this class of absorptive layer is that the PMMA layer is conventionally wet developed which can cause undercutting of the photoresist image and a loss in resolution. Additionally, it has been found that materials such as PMMA tend to dissolve to a degree into the overlying photoresist layer, forming an interface which is insoluble in conventional developers and resistant to plasma etching.

A recording medium which does not have the disadvantages of either the polyimide or the poly(methylmethacrylate)-based media is provided in accordance with this invention.

SUMMARY OF THE INVENTION

An improved recording medium comprises an absorptive layer of an insoluble, cured, polyfunctional acrylate or methacrylate monomer containing a suitable dye and, thereover, a layer of a photoresist material which is resistant to oxygen plasma.

DETAILED DESCRIPTION OF THE INVENTION

The base or absorptive layer of the subject recording medium is comprised of a polymerized polyfunctional acrylate or methacrylate monomer containing a suitable dye. These monomers contain more than one "acrylate moiety", i.e. the chemical group represented by the formula

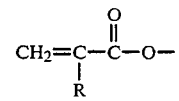

wherein R is hydrogen or methyl. Representative examples of this art-recognized group of monomers include trimethylolpropane triacrylate, trimethylolpropane trimethacrylate, hexamethylenediol diacrylate and pentaerythritol triacryate, with the latter being preferred.

The dye component of the absorptive layer composition must possess all of a list of critical properties. First, it must have a window of high absorption at the specific wavelengths used to irradiate the photoresist layer. Generally, this means that the dye should have high absorbance in the range 350 nm to 450 nm and be essentially transparent above 500 nm to permit alignment of the pattern during irradiation. The dye must be compatible with the materials which the absorptive layer contacts, both in the substrate and in the overlying layer or layers. The dye must be soluble in the solvent utilized for the absorptive layer composition and must be able to withstand processing temperatures necessary for the remainder of the structure, i.e. it must be stable up to a temperature of at least about 150° C., preferably up to about 200° C. Suitable dyes useful in the subject structures include, for example, Macrolex Yellow 6G, Mobay Corp., which is a methine dye, known generically as Disperse Yellow 201, Sudan III, which chemically is 1-(azophenyl-4-azophenyl)-2-naphthol, and the like.

In addition to the monomer and the dye, the compositions utilized to prepare the absorptive layer of this invention contain a conventional photoinitiator and a suitable solvent. The photoinitiator is preferably a benzophenone- or benzoquinone-type free radical initiator such as Irgacure 651 or Irgacure 184 of Ciba-Geigy Corp., 2-chlorothioxanthrone, dodecylthioxanthrone and the like. The use of such compounds to enhance the polymerization of organic monomers is considered to be within the purview of those of ordinary skill in the art.

The solvent for the compositions utilized to form the absorptive layer is an organic solvent such as propylene glycol methyl ether acetate, available from Dow Corporation under the trademark Dowanol PMA, ethylene glycol ethyl ether acetate, cyclohexanone and the like. The absorptive compositions suitably contain from about 10 to 50, preferably from about 25 to 35, percent by weight of the monomer, from about 0.5 to 5, preferably from about 2 to about 4, percent by weight of the dye and an effective amount of the photoinitiator, generally from about 1 to 2 percent by weight.

The absorptive layer compositions are thoroughly blended and applied to the substrate, suitably by spin-coating, and the coating is thereafter cured to form an absorptive layer. The substrate may be any material which is to be treated, e.g. etched, ion implanted and the like, using the subject recording media. The substrate is suitably a semiconductor material such as single crystal silicon, gallium arsenide, polycrystalline materials, vitreous materials and the like. Frequently, the substrate is comprised of two or more layers and may have topographical features. It is conventional to planarize such surface topography with a suitable organic material such as a polyimide, a novolac resin-based positive photoresist or the like. When the substrate has topography, it is within the scope of this invention to planarize the surface with such a material and apply the subject recording media thereover.

The term "curing" in the context of this invention indicates a two-step procedure. Initially, the coating is irradiated with an irradiation source that will supply a continuous or pulsed energy that will rapidly solidify the coating, suitably in less than about two minutes and preferably in less than about one minute. A preferred irradiation source is a pulsed xenon lamp which produces intense UV light, i.e. about 5000 A/cm$^2$ current density at a 200 to 800 nm output. Medium or high pressure mercury lamps can also be utilized in the initial step. The first step in the curing of the absorptive layer typically requires only about 30 to 60 seconds of irradiation, depending on its thickness.

The initial irradiation of the absorptive composition polymerizes the monomer substantially throughout and particularly at the surface thereby forming an absorptive layer. It is necessary that the polymerization be complete at the surface to prevent intermixing with the subsequently applied photoresist layer.

In the second step in the curing of the absorptive composition, the layer is baked, suitably at between about 100° and 250° C., preferably at about 200° C., for from about 5 to 30, preferably about 10 minutes. The baking step removes residual solvent and assures complete polymerization of the monomer.

The polyfunctional acrylate monomers are useful in the subject absorptive layers only if cured in two steps as defined herein. Previously, polyfunctional acrylate monomers have been regarded as too brittle to be used in radiation cured coatings for any purpose without the presence of other monomers or plasticizers, and were also regarded as being too volatile to remain as a thin film during the baking step which is necessary to remove the residual high-boiling coating solvent. It is necessary that the coating solvents be high boiling with a low evaporation rate to produce uniform coatings using spin-coating techniques. Neither of these potential problems is significant with regard to the subject structures.

After the baking step, the thickness of the subject absorptive layer is suitably between about 0.5 and 1.0, micrometer. When the substrate surface has topographical features, the thickness of the absorptive layer is suitably from about 1 to 4 times the height of the tallest topographical feature.

A layer of photoresist is then applied over the absorptive layer, suitably by conventional techniques such as spin-coating. Any photoresist composition which possesses oxygen plasma resistance and meets the solubility and other requirements detailed herein may be used. The photoresist may be either positive or negative acting. It is preferred that the photoresist have an etch rate in oxygen plasma not greater than about one-third of the etch rate of the absorptive layer. The final thickness of the photoresist layer is generally from about 0.5 to 2, suitably about 1 micrometer. The thickness of the photoresist layer should be at least one-half of the thickness of the absorptive layer. Suitable commercial photoresists include diazoquinone/novolac resin type resists such as Microposit 1400-30 of the Shipley Co., AZ 1350J-SF of the American Hoechst Corporation, HP-204 of Philip A. Hunt Chemical Corporation and the like. Another type of photoresist which is useful in the subject structures is one which will degrade upon exposure to an oxygen plasma to form silicon dioxide, which becomes an impervious hardmask. Suoh photoresists include for example, polysiloxanes and silicon-containing acrylate polymers.

The photoresist composition is applied, dried and baked according to conventional processes. It has been found from experiments conducted with a number of photoresists that the thickness of the photoresist layer when applied over the subject absorptive layers is the same as a layer formed in the same manner on a silicon wafer. This is an indication that there is no intermixing of the layers. Further, there has not been a single instance of separation of any of the photoresist compositions tested from the absorptive layer during development or other processing steps. The photoresist layer is irradiated through a suitable mask with UV light, typically in the range of 350 to 450 nm, utilizing conventional equipment and then wet developed with the reagent recommended by the manufacturer.

The portion of the absorptive layer exposed by development of the photoresist layer is then etched utilizing an oxygen plasma. The parameters of the oxygen plasma etch may vary within conventionally recognized ranges. The subject absorptive layers possess good image resolution down to the substrate with minimal loss of photoresist.

The subject recording medium is advantageous in that it provides excellent pattern delineation with a wide processing latitude. The absorptive layer is dry developed, thus minimizing the possibility of loss of resolution resulting from undercutting of the photoresist which can occur utilizing wet, i.e. solvent, development of the base layer. There is no intermixing of the two layers in the subject structure, thus eliminating the need for an intermediate or barrier layer. Finally, the subject structures are at least as effective as known bi-layer recording media in preventing linewidth distortions caused by reflected irradiating light.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

Thirty grams of pentaerythritol triacrylate, 3.0 grams of Macrolex Yellow 6G, Mobay Corp., and 1.5 grams of the benzophenone-type photoinitiator Irgacure 651, Ciba-Geigy Corp. were stirred into 70.0 grams of Dowanol PMA, propylene glycol methyl ether acetate(Dow Corp.). The mixture was stirred for one hour under ambient conditions and filtered through a 10 micrometer PTFE filter.

The solution was spin-coated onto a silicon wafer at 4000 rpm for 30 seconds. The coating was irradiated for 60 seconds under a nitrogen atmosphere with a pulsed xenon lamp having a current density of 5000A/cm$^2$ and an output of 200 to 800 nm. After irradiation curing, the wafer was baked at 200° for 10 minutes to remove any residual solvent and complete the polymerization of the monomer. The thus-formed absorptive layer was 0.7 micrometer thick. The absorptive layer was washed with acetone to remove any dye which might be exposed on the surface and which might dissolve into the subsequently applied photoresist layer. The absorptive layer was found to be totally insoluble in the conventional photoresist solvents propylene glycol methyl ether acetate, ethylene glycol ethyl ether acetate, and cyclopentanone.

EXAMPLE 2

The positive resist Microposit 1400-30, Shipley Corp., was applied to a control silicon wafer and to the coated silicon wafer prepared in Example 1 under identical conditions, i.e. spin-coating at 6000 rpm for 30 seconds and baking at 90° for 15 minutes. The combined thickness of the resist plus the absorptive layer was 2.0 micrometers, thus the thickness of the photoresist layer was 1.3 micrometers. This was the same as that of the photoresist layer deposited directly on a silicon wafer, measured with a profilometer. That the measured thickness of the photoresist layer plus the absorptive layer was the sum of their individual thicknesses indicates that there was substantially no mutual dissolution or interreaction between the layers.

EXAMPLE 3

The wafer coated with the absorptive layer and the photoresist layer prepared in Example 2 was flood irradiated for 60 seconds with UV light from a medium pressure mercury lamp having an output exceeding 100mj/cm$^2$. The wafer was immersed in Waycoat HPRD LSI Developer, Phillip A. Hunt Chemical Corp., diluted 1:1 with deionized water, for 60 seconds to completely remove the photoresist layer. The thickness of the absorptive layer remained unchanged at 0.7 micrometers.

The wafer and the control wafer of Example 2 were placed in a conventional oxygen plasma reactor and etched for 20 minutes. The 0.7 micrometer absorptive layer was completely removed and the surface of the wafer was clean. The thickness of the photoresist coating on the control wafer was found to be 1.1 micrometers. These results indicate that it is feasible to pattern etch the subject absorptive layers in an oxygen plasma without significant loss of thickness in an overlying photoresist layer.

EXAMPLE 4

A wafer containing absorptive and photoresist layers prepared according to Examples 1 and 2 was pattern irradiated with light at 436 nm by a TRE 800 Stepper, TRE Semiconductor Equipment Corporation. The irradiating dosage was about 20 percent higher than conventional levels to compensate for loss of reflected light from the substrate. The pattern, a series of uniform lines and spaces, was developed as in Example 3. Patterns of equal lines and spaces as fine as 1.0 micrometer were clearly discernable. No separation of the photoresist pattern from the absorptive layer was observed. The pattern was uniform over the entire wafer.

The wafer was placed in a conventional plasma etcher and etched in an oxygen plasma for 8 minutes at 28°, 400 W of power and 10 mtorr of pressure with an oxygen flow of 30 sccm. The exposed portion of the absorptive coating was completely removed to the silicon substrate. The photoresist pattern was transferred through the absorptive layer with no loss in resolution. Erosion of the photoresist layer was only 0.4 micrometer.

EXAMPLE 5

The substrate for this example was a disk-shaped sapphire wafer three inches in diameter having on its surface epitaxial silicon islands 120 micrometers square and 0.5 micrometer high. The wafer was coated with a 0.3 micrometer thick coating of highly reflective tantalum disilicide by conventional cosputtering of tantalum and polycrystalline silicon. The tantalum disilicide surface was primed with hexamethylene disilazane vapor and then coated with 0.7 micrometer of the absorptive composition and 1.3 micrometers of photoresist as described in Example 2. The structure was irradiated, developed and oxygen plasma etched as described in Example 4. The oxygen plasma etch was carried out for 12 minutes. A pattern of 1.25 micrometer lines was cleanly etched to the tantalum disilicide surface without loss of resolution due to surface reflection and without the constrictions, conventionally termed "notching" that often occur utilizing conventional resist systems where a line is etched over the edge of substrate topography.

The advantageous properties of the subject resist system are clearly demonstrated by this and the foregoing examples.

We claim:
1. A process of forming a relief pattern on a substrate of a multilayer photoresist recording medium consisting of an absorptive layer and a photoresist layer thereover, said process comprising:
(a) coating the substrate with a composition consisting essentially of a solution of a polyfunctional acrylate or methacrylate monomer, a dye having a high absorption at the wavelengths useful to irradiate the photoresist layer and a photoinitiator in a solvent;
(b) curing said composition in two steps comprising irradiating with an irradiation source that will rapidly solidify the composition to form an absorptive layer and baking to remove residual solvent therefrom;
(c) applying a layer of oxygen plasma-resistant photoresist thereover;
(d) pattern irradiating and developing the photoresist layer, thus exposing a portion of the absorptive layer; and
(e) plasma etching the exposed absorptive layer with an oxygen plasma.

2. A process in accordance with claim 1 wherein the polyfunctional monomer is selected from the group consisting of trimethylolpropane triacrylate, trimethylolpropane trimethacrylate, hexamethylenediol diacrylate and pentaerythritol triacrylate.

3. A process in accordance with claim 2, wherein the polyfunctional monomer is pentaerythritol triacrylate.

4. A process in accordance with claim 1, wherein the dye is Disperse Yellow 201.

5. A process in accordance with claim 1, wherein the photoresist is a diazoquinone/novolac resin type positive photoresist.

6. A process in accordance with claim 1, wherein the composition is irradiated in step (b) with a pulsed xenon lamp.

* * * * *